United States Patent [19]

Ruebsam

[11] Patent Number: 4,755,661
[45] Date of Patent: Jul. 5, 1988

[54] CONNECTION OF ELECTRONIC COMPONENTS IN A CARD

[76] Inventor: Herrn H. Ruebsam, Otto-Hahn-Str. 50, 6072 Dreieich, Fed. Rep. of Germany

[21] Appl. No.: 948,034

[22] Filed: Dec. 31, 1986

[30] Foreign Application Priority Data

Jan. 10, 1986 [DE] Fed. Rep. of Germany ....... 3600470

[51] Int. Cl.$^4$ ............................................. G06K 19/06
[52] U.S. Cl. .................................... 235/492; 235/375; 235/488
[58] Field of Search ......................... 235/375, 492, 488

[56] References Cited

U.S. PATENT DOCUMENTS

| | | |
|---|---|---|
| 4,222,516 | 9/1980 | Badet et al. |
| 4,380,699 | 4/1983 | Monnier et al. |
| 4,463,971 | 8/1984 | Hoppe et al. |
| 4,511,796 | 4/1985 | Aigo |
| 4,539,472 | 9/1985 | Poetker ........................ 235/492 X |
| 4,550,248 | 10/1985 | Hoppe et al. |
| 4,552,383 | 11/1985 | Hoppe et al. |
| 4,563,575 | 7/1986 | Hoppe et al. |
| 4,578,573 | 3/1986 | Flies et al. |

Primary Examiner—Harold I. Pitts
Attorney, Agent, or Firm—Nixon & Vanderhye

[57] ABSTRACT

An improved data and/or program carrier housing structure in the form of a data card or the like which securely protects integrated circuit modules housed therein from physical damage. The card of the present invention is designed such that the illegal use or destruction of the data is only possible for the total physical destruction of the card. The electronic integrated circuit carrier includes a plastic layer which is metallized on both sides and etched where electronic components are to be connected. An encircling structure is provided which goes around each electronic component that is housed within the card. The encircling structure includes non-metalized limbs of the plastic layer which form a protective plastic ring which is larger than the electronic element housing(s). The electronic elements are disposed within the interior space of the protective ring and are electrically and mechanically connected to the metallized plastic layer.

19 Claims, 2 Drawing Sheets

CONNECTION OF ELECTRONIC COMPONENTS IN A CARD

FIELD OF THE INVENTION

This invention relates to an integrated circuit carrier which is in the shape of a credit card or the like and which is configured to form a protective nested structure for integrated circuit module housed therein. The integrated circuit module store coded data which may be utilized as a security code to, for example, allow entrance to an area in which only authorized personnel are permitted. Alternatively, it is contemplated that the data in the IC module may serve as an authorizing ID for an automatic bank telling system or the like. It can readily be seen that it is important to protect the IC module so that it is not physically damaged. It is likewise important to render the card as tamper-proof as possible.

BACKGROUND OF THE INVENTION

The prior art shows credit cards or keys having electronic devices mounted therein with protection being provided for the electronic devices. For example, U.S. Pat. Nos. 4,550,248 and 4,563,575 to Hoppe et al show two different ways for embedding an electronic element between various protective layers. Furthermore, U.S. Pat. No. 4,511,796 also shows an electronic element that is mounted in such a way so as to protect the electronic element housed therein.

U.S. Pat. No. 4,539,472 relates to a data processing card system and method for performing the same. The system 10 is mounted on the card 46 and includes a circuit chip 14 mounted to a flexible film carrier member 16 coupled to a substrate carrier 30. The substrate carrier includes an electrical pattern 40 for coupling to the leads of the circuit chip 14.

U.S. Pat. No. 4,578,573 relates to a key-like electronic device and method for manufacturing the same including a plastic body arranged around a printed circuit substrate. Electrical contacts 16, which are connected to an embedded electrical circuit, are disposed to grooves 18 of the key 16 to form electrical contact areas.

SUMMARY OF THE INVENTION

The present invention provides an improved data and/or program carrier housing structure in the form of a data card or the like which securely protects the integrated circuit modules housed therein from physical damage. The data card of the present invention reserves a relatively large area for housing integrated circuit modules to thereby provide an enhanced data capacity while not physically increasing the size of the card. In addition, the card of the present invention is designed such that the illegal use or destruction of the data is only possible for the total physical destruction of the card.

The electronic integrated circuit carrier of the present invention includes a plastic layer which is metallized on both sides and etched where electronic components are to be connected. An encircling structure is provided which goes around each electronic component that is housed within the card. The encircling structure includes non-metalized limbs of the plastic layer which form a protective plastic ring which is larger than the electronic element housing(s). The electronic elements are disposed within the interior space of the protective ring and are electrically and mechanically connected to the metallized plastic layer.

BRIEF DESCRIPTION OF THE DRAWINGS

The invention will be explained further by the following illustrations.

DETAILED DESCRIPTION

Figure 1:
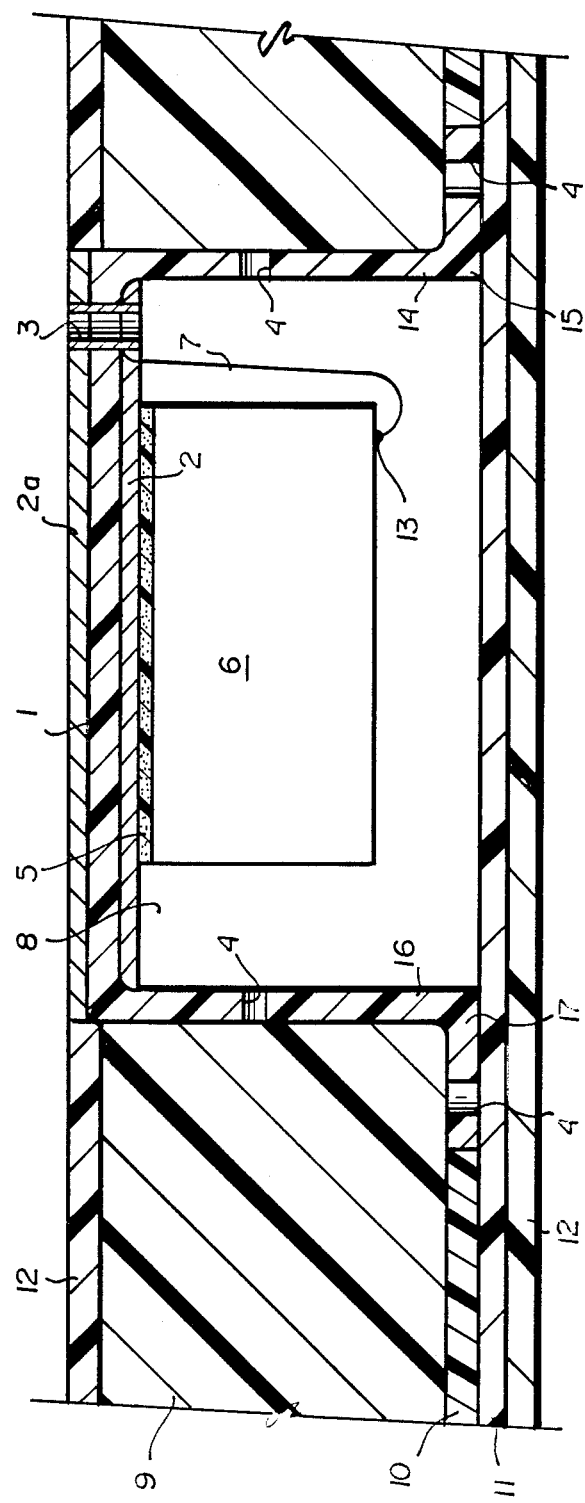
FIG. 1 is a side view of an electronic data and/or program carrier in the shape of a card with a built in electronic element.

FIG. 1 presents a side view of a completed electronic data and/or program carrier in the shape of a card. An electronic element with an integrated circuit (6) is connected to a conductor track (2), for example, by using glue (5). A conductor track (2) is metallized on a plastic film layer (1) which includes limbs (14 and 16) and the connection rims (15 and 17) and which forms a nested structure for the electronic element (6). The layer may, for example, be made of a PVC film. this nested structure protects the electronic element. The metallized layer is etched to accommodate the integrated circuit module 6. Across from the inner conductor track (2) an outer conductor track (2a) is located which reveals contact surfaces. The inner and outer conductor tracks (2 and 2a) are connected to each other by way of a drilled aperture which is metallized on its periphery. This allows for electrical contact between the two tracks. The limbs (14 and 16) of the plastic film (1) are connected through various means and materials with the core layer (9). The core layer may be made of plastic, cardboard, or fiberboard. The limbs (14 and 16) and the connection rims (15 and 17) are covered with a number of perforations (4). When connecting the core foil (9) with the mentioned limbs and connection rims, the plastic material enters the perforations after heating and hardens, thus creating a secure connection comparable to that of nails or rivets. This plastic material may be, for example, PVC.

The space (8) between the electronic element (6) and the limbs (14 and 16) is filled with a two component epoxy glue or a similar material for encasing the circuit 6 within the card. The space 8 is thereafter covered with a coating material after the electronic connection between the electronic element and the inner conductor track (2) using the conductor (7) has been established. This process leads not only to the protection of the conductor (7), but also of the entire element. The coating material may also be PVC.

An intermediate film 10 of the same strength is connected to the connection rims (15 and 17) in such a manner so that the peripheries are even and the surface of the card is smooth. The layer 10 may be PVC, or a similar material. The bottom side of the card, which does not contain any contacts, is coated by a covering film (11). This layer may be PVC or a similar material. This covering film can be imprinted with information that is optically readable. Also located on this side of the card is a continuous coating film (12). This coating film (12) is also to be found on the other side of the card, but it also contains grooves for the conductor track (2a)

enabling the sliding contacts or the information stored in the electronic element (6) to read a given program sequence. The coating layer may be PVC or of a similar material.

Figure 2:
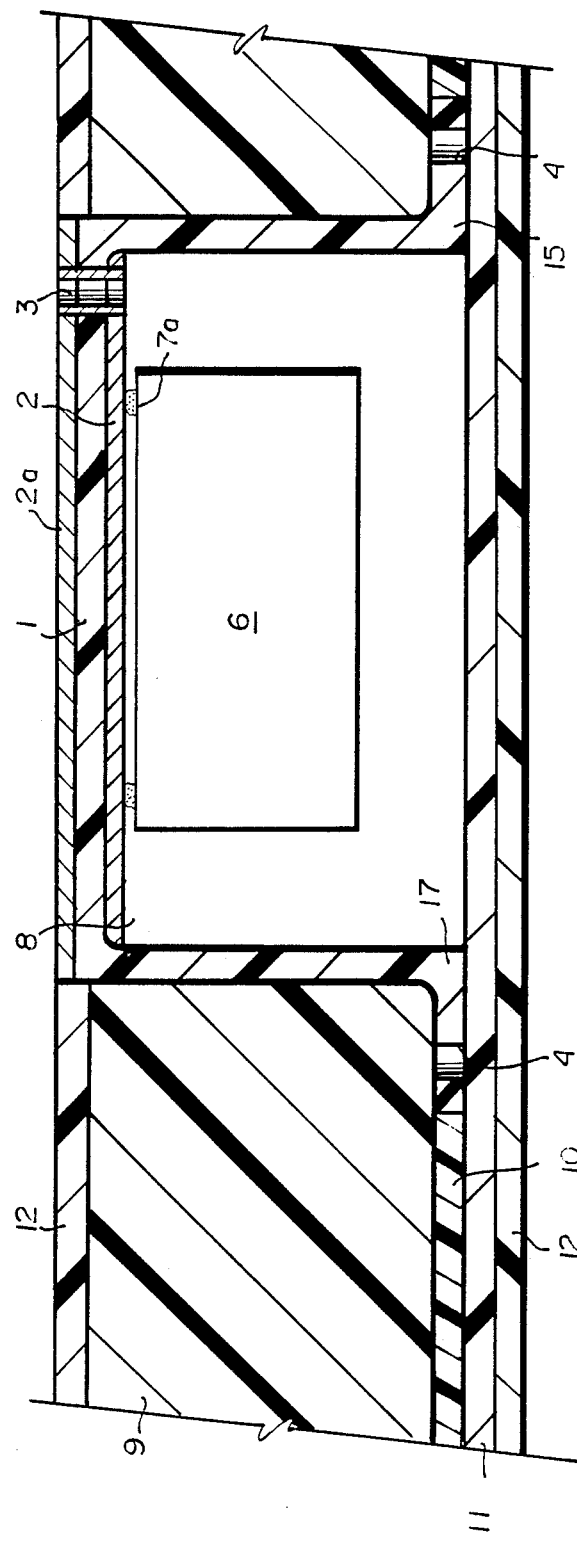
FIG. 2 is a side view of an electronic data and/or program carrier in the shape of a card after some further development of the model with a built in electronic element.

FIG. 2 reflects a further development of the invention. The elements corresponding to FIG. 1 are labeled by the same numbers. The electronic element (6) is directly connected to the contact (7a) which is directly connected to the inner track (2) of the film (1). Connections my be obtained through soldering. Such a construction form not only simplifies the production process dramatically, but also improves the security and function of the data and program carrier since there are no long conducting lines.

Figure 3:
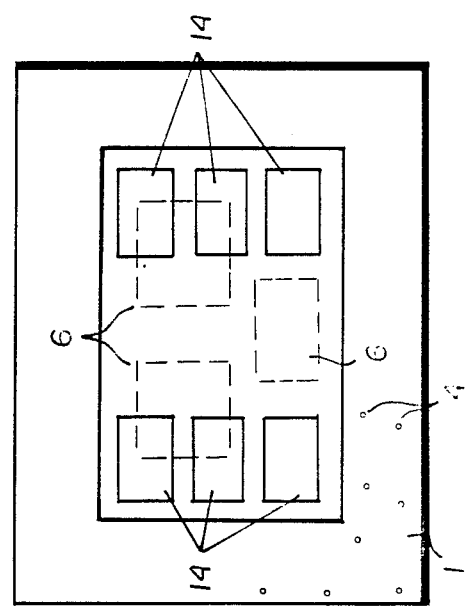
FIG. 3 is a top view of the card side containing the contacts with several built in electronic elements in a somewhat enlarged form.

FIG. 3 reflects the top view of a card containing several electronic elements (6) which are located under the contact surfaces (14) and connected to these electronically.

As a result of the invention, the data and/or programs carrier of the data card has a large data capacity. The data card consists of a number of electronic elements which contain integrated circuits and form a homogeneous unit with the core film and the protective films. This data and/or program carrier in the form of a card is not larger or wider than the known credit or automatic bank teller card, but it can house a multiple selection of data capacity at a higher security level than found in normal plastic cards. The illegal use or the destruction of the data is now only possible through the total physical destruction of the card.

The electronic element with its connection rim can also be built into other shape or forms than a card, for example, in a key or a pin (in the form of a pen). These elements can be programmed with a security code and can thus act as an actual key.

While the present invention has been described in terms of its presently preferred form, it is not intended that the invention be limited only by the described embodiment. It will be apparent to those skilled in the art that many modifications my be made which nevertheless lie within the spirit and intended scope of the invention asd defined in the claims which follow.

I claim:

1. A housing for at least one electronic integrated circuit component, said card comprising:
    at least one electronic integrated circuit module having at least a first, second and third surfaces;
    a nested structure for protecting said at least one module including:
    a plastic film layer having a first portion adjacent to and enclosing said first surface and a second portion for encircling at said second and third surfaces of said at least one integrated circuit module;
    said first portion of said plastic film having an inner surface and outer surface with conductive tracks disposed thereon;
    said inner conductive track being electrically coupled to said integrated circuit component; and
    said outer conductive track disposed on the surface of said housing.

2. A housing according to claim 1, wherein said housing is in the shape of a card.

3. A housing according to claim 2, further including a coating film on the surface of the housing and having grooves therein, wherein aid outer conductor track is disposed in said grooves.

4. A housing according to claim 1, further including a core layer disposed to encircle said module and disposed adjacent said second portion of said plastic layer.

5. A housing according to claim 1, wherein said plastic layer includes a plurality of apertures, said apertures being filled with means connected to said core layer for securely connecting said plastic layer and to said core layer.

6. A housing according to claim 1, wherein said inner and outer conductor tracks are electrically coupled via a metallized aperture interconnecting said inner and outer conductive tracks.

7. A housing according to claim 1, further including a covering layer enclosing a further surface of said component, said plastic layer including a third portion disposed substantially perpendicularly to said second portion and secured to said covering layer.

8. A housing according to claim 1, wherein at least two electronic integrated circuit modules are protectively housed.

9. A housing according to claim 7, wherein said second portion extends from said third portion to a point extending beyond said at least one module.

10. A housing according to claim 1, wherein said inner conductive track is connected to said module by a soldered connection.

11. A method for securely and protectively disposing at least one integrated circuit component in a card carrier comprising the steps:
    disposing at least one integrated circuit component within the card carrier;
    metallizing an inner surface and outer surface of a first portion of a plastic layer;
    protectively nesting the integrated circuit component within the card carrier including the steps of:
    encircling the said at least one integrated circuit component with a second portion of said plastic layer;
    adhering and electrically coupling said inner metallized surface to said at least one component.

12. A method according to claim 10, further including the step of encircling said at least one component with a core layer.

13. A method according to claim 12, further including the step of drilling a plurality of apertures in the second portion of the plastic layer and inserting a plastic material into said aperture to securely connect the second portion to the core layer.

14. A method according to claim 12, further including the step disposing a coating layer on the surface of the card and disposing grooves in the coating layer such that the outer conductor surface lies in the grooves.

15. A method according to claim 11, wherein the second portion is disposed substantially perpendicularly to the first portion and extends from beneath the said at least one component to a point above the said at least one component.

16. A method according to claim 11, further including housing at least two integrated circuit modules in the card.

17. A method according to claim 11, further including filling the space between the integrated circuit component and the second portion wtih a substance that securely encases the integrated circuit component within the card.

18. A method according to claim 11, further including providing the plastic layer with a rim which is substantially perpendicularly disposed to said first portion.

19. A method according to claim 11, further including etching the plastic layer to accommodate the integrated circuit housing.

* * * * *